US010497902B2

(12) United States Patent
Moon et al.

(10) Patent No.: US 10,497,902 B2
(45) Date of Patent: Dec. 3, 2019

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Jeongwoo Moon, Yongin-si (KR); Sangho Park, Yongin-si (KR); Joonyoup Kim, Yongin-si (KR); Joungkeun Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/031,315

(22) Filed: Jul. 10, 2018

(65) Prior Publication Data

US 2018/0323405 A1   Nov. 8, 2018

Related U.S. Application Data

(63) Continuation of application No. 14/960,818, filed on Dec. 7, 2015, now Pat. No. 10,033,013.

(30) Foreign Application Priority Data

Dec. 8, 2014   (KR) .................. 10-2014-0175376

(51) Int. Cl.
  *H01L 51/52*   (2006.01)
(52) U.S. Cl.
  CPC ...... *H01L 51/5271* (2013.01); *H01L 51/5253* (2013.01); *H01L 2251/5315* (2013.01)

(58) Field of Classification Search
  CPC .................. H01L 51/5256; H01L 51/5271
  See application file for complete search history.

(56) References Cited

U.S. PATENT DOCUMENTS

| 6,246,179 B1 | 6/2001 | Yamada |
| 6,281,634 B1 | 8/2001 | Yokoyama |
| 10,033,013 B2* | 7/2018 | Moon ................ H01L 51/5253 |
| 2005/0007300 A1 | 1/2005 | Kato |
| 2005/0135087 A1 | 6/2005 | Mita et al. |
| 2005/0280362 A1 | 12/2005 | Shore et al. |
| 2009/0236981 A1 | 9/2009 | Chang et al. |
| 2010/0141116 A1* | 6/2010 | Nomura ........... B29D 11/00634 313/498 |
| 2010/0289019 A1 | 11/2010 | Katz et al. |
| 2011/0171584 A1 | 7/2011 | Suh et al. |
| 2013/0041235 A1 | 2/2013 | Rogers et al. |

(Continued)

FOREIGN PATENT DOCUMENTS

| JP | 2005-177084 | 7/2005 |
| JP | 2009-245611 | 10/2009 |

(Continued)

*Primary Examiner* — Fernando L Toledo
*Assistant Examiner* — Valerie N Newton
(74) *Attorney, Agent, or Firm* — Cantor Colburn LLP

(57) ABSTRACT

An organic light-emitting display apparatus includes a substrate, a display unit formed on the substrate and including a plurality of emission regions, an encapsulant formed on the display unit and including at least one organic layer and at least one inorganic layer; and a plurality of reflectors formed on the encapsulant and disposed to respectively overlap at least regions around the plurality of emission regions.

18 Claims, 13 Drawing Sheets

(56) References Cited

U.S. PATENT DOCUMENTS

| | | | | |
|---|---|---|---|---|
| 2014/0305900 | A1* | 10/2014 | Rogers | H05K 13/00 216/13 |
| 2015/0041777 | A1* | 2/2015 | Chung | H01L 51/5271 257/40 |
| 2016/0148984 | A1 | 5/2016 | Kim et al. | |

FOREIGN PATENT DOCUMENTS

| | | |
|---|---|---|
| KR | 10-2005-0007155 | 1/2005 |
| KR | 10-2009-0099744 | 9/2009 |
| KR | 10-1108162 | 1/2012 |

* cited by examiner

ORGANIC LIGHT-EMITTING DISPLAY APPARATUS AND METHOD OF MANUFACTURING THE SAME

CROSS-REFERENCE TO RELATED APPLICATIONS

This application is a continuation of U.S. patent application Ser. No. 14/960,818, filed on Dec. 7, 2015, which claims priority to, and the benefit of, Korean Patent Application No. 10-2014-0175376, filed on Dec. 8, 2014, in the Korean Intellectual Property Office, the disclosure of which is incorporated herein in its entirety by reference.

BACKGROUND

Field

One or more embodiments relate to organic light-emitting display apparatuses and methods of manufacturing the same.

Description of the Related Technology

An organic light-emitting display apparatus is a self-luminous display apparatus. Thus, when a voltage is applied to an organic layer including a positive electrode, a negative electrode, and an organic emission layer between the positive electrode and the negative electrode, electrons and holes are recombined in the organic emission layer to emit light. The organic light-emitting display apparatus is considered as a next-generation display apparatus due to its various advantages over a cathode ray tube (CRT) or a liquid crystal display (LCD), such as small weight and thickness, large viewing angle, high response speed, and low power consumption.

In the organic light-emitting display apparatus, an organic light-emitting device is disposed in a display region. The organic light-emitting display apparatus includes a pixel electrode, an opposite electrode opposite the pixel electrode, and an emission layer between the pixel electrode and the opposite electrode. Since the organic light-emitting device may be easily damaged by external factors such as moisture or oxygen, encapsulation is used to prevent the infiltration of external impurities.

Recently, to address concerns regarding the slimness and/or flexibility of an organic light-emitting display apparatus, a thin film encapsulation constituted by a plurality of layers including organic layers and inorganic layers or a plurality of inorganic layers has been used to encapsulate an organic light-emitting device.

SUMMARY OF CERTAIN INVENTIVE ASPECTS

One or more embodiments include an organic light-emitting display apparatus in which an organic light-emitting device functions as a mirror while the organic light-emitting device does not emit light.

Additional aspects will be set forth in part in the description which follows and, in part, will be apparent from the description, or may be learned by practice of the presented embodiments.

According to one or more embodiments, an organic light-emitting display apparatus includes: a substrate; a display unit formed on the substrate and including a plurality of emission regions; an encapsulant formed on the display unit and including at least one organic layer and at least one inorganic layer; and a plurality of reflectors formed on the encapsulant and disposed to respectively overlap at least regions around the plurality of emission regions.

The at least one organic layer may include an organic layer disposed as a top layer of the encapsulant.

The organic light-emitting display apparatus may further include a planarization layer formed between the encapsulant and the plurality of reflectors.

The organic light-emitting display apparatus may further include a plurality of openings disposed to be adjacent to the plurality of reflectors and corresponding to the plurality of emission regions respectively.

The organic light-emitting display apparatus may further include a plurality of color filters formed to fill the plurality of openings.

The color filter may have same color as a light emitted from the emission region.

A width of each of the openings may be different from a width of the emission region corresponding to each of the openings.

A difference between the width of each of the openings and the width of the emission region corresponding to each of the openings may be about 20 µm or less.

A sum of areas of the plurality of reflectors may be larger than a sum of areas of the plurality of openings.

The reflector may include at least one of aluminum (Al), Al alloy, argentum (Ag), Ag alloy, aurum (Au), or Au alloy.

The reflector may have a thickness of about 100 nm or more.

The planarization layer may include at least one of polyimide, polyacryl, or polysiloxane.

The display unit may further include a pixel definition layer that defines the plurality of emission regions.

The pixel definition layer may include at least one of a black material or a material having an optical density (OD) of about 1.

The display unit may further include a plurality of organic light-emitting devices respectively disposed in the plurality of emission regions and the plurality of organic light-emitting devices may emit light at least toward the encapsulant.

According to one or more embodiments, a method of manufacturing an organic light-emitting display apparatus includes: forming a display unit on a substrate; forming an encapsulant by alternately stacking at least one organic layer and at least one inorganic layer on the display unit; and forming a plurality of reflectors on the encapsulant to respectively overlap at least regions around the plurality of emission regions.

The at least one organic layer comprises an organic layer disposed as a top layer of the encapsulant.

The method of manufacturing an organic light-emitting display apparatus may further include forming a planarization layer between the encapsulant and the plurality of reflectors.

The method of manufacturing an organic light-emitting display apparatus may further include forming a plurality of color filters to fill a plurality of openings adjacent to the plurality of reflectors respectively.

Forming the display unit may include: forming a pixel electrode in the emission region on the substrate; forming a pixel definition layer to surround side surfaces of the pixel electrode; forming an organic emission layer on the pixel electrode; and forming an opposite electrode to cover the organic emission layer and the pixel definition layer.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION OF CERTAIN INVENTIVE EMBODIMENTS

Figure 1:
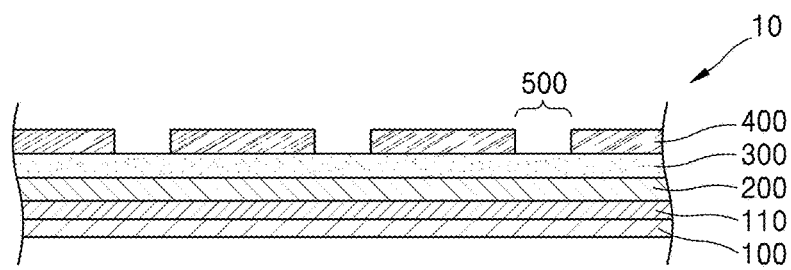
FIG. 1 is a schematic cross-sectional view of an organic light-emitting display apparatus according to an embodiment.

Reference will now be made in detail to embodiments, examples of which are illustrated in the accompanying drawings, wherein like reference numerals generally refer to like elements throughout. In this regard, the presented embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The inventive concept may include various embodiments and modifications, and certain embodiments thereof are illustrated in the drawings and will be described herein in detail. However, it will be understood that the inventive concept is not limited to the presented embodiments and includes all modifications, equivalents, and substitutions falling within the spirit and scope of the inventive concept. In the following description, detailed descriptions of well-known functions or configurations will be omitted since they would unnecessarily obscure the subject matters of the inventive concept.

Although terms such as "first" and "second" may be used herein to describe various elements or components, these elements or components should not be limited by these terms. These terms are only used to distinguish one element or component from another element or component.

It will be understood that when a layer, film, region, or substrate is referred to as being "on" another layer, film, region, or substrate, it may be directly on the other layer, film, region, or substrate, or an intervening layer, film, region, or substrate may be present.

Hereinafter, certain embodiments will be described in detail with reference to the accompanying drawings. In the following description, like reference numerals generally denote like elements, and redundant descriptions thereof will be omitted. In the drawings, thicknesses may be exaggerated to clearly describe several layers and regions. Also, in the drawings, thicknesses of some layers and regions may be exaggerated for convenience of description.

FIG. 1 is a schematic cross-sectional view of an organic light-emitting display apparatus 10 according to an embodiment.

Referring to FIG. 1, the organic light-emitting display apparatus 10 according to an embodiment may include a substrate 100, a display unit 110 formed on the substrate 100, an encapsulant 200 formed to cover the display unit 110, a planarization layer 300 formed on the encapsulant 200, and a reflector 400 formed on the planarization layer 300. Also, the organic light-emitting display apparatus 10 may further include a plurality of openings 500 disposed to be adjacent to the reflector 400.

The substrate 100 may include various materials.

The substrate 100 may include a flexible material. For example, the substrate 100 may include plastics having high heat resistance and high endurance, such as polyethyelene-terepthalate (PET), polyethyelenennapthalate (PEN), polycarbonate (PC), polyallylate, polyetherimide (PEI), polyethersulphone (PES), and polyimide (PI). However, embodiments are not limited thereto, and the substrate 100 may include various flexible materials.

As an example embodiment, the substrate 100 may include various materials such as glass materials or metal materials.

As an example embodiment, the organic light-emitting display apparatus 10 may be a top emission type in which an image is emitted toward the encapsulant 200. Thus, in the case of a top emission type, the substrate 100 may not necessarily include a transparent material. However, a substrate (not illustrated) opposite to the substrate 100 includes a transparent material. On the other hand, in the case where the organic light-emitting display apparatus 10 is a bottom emission type in which an image is emitted toward the substrate 100, the substrate 100 includes a transparent material, but a substrate opposite to the substrate 100 may not necessarily include a transparent material.

When the substrate 100 does not include a transparent material, the substrate 100 may include an opaque material, such as, for example, an opaque metal material. When the substrate 100 includes a metal, the substrate 100 may include at least one of carbon (C), iron (Fe), chromium (Cr), manganese (Mn), nickel (Ni), titanium (Ti), molybdenum (Mo), and stainless steel (SUS), but is not limited thereto.

The display unit 110 is formed on the substrate 100. The term "display unit 110" used herein is a common designation of an organic light-emitting device (OLED) and a thin film transistor (TFT) array for driving the OLED, and commonly refers to an image display unit and a driving unit for displaying an image. The display unit 110 may include a plurality of emission regions in which organic light-emitting devices OLED are respectively disposed.

The encapsulant 200 is formed on the substrate 100 to cover the display unit 110. Since the organic light-emitting device OLED included in the display unit 110 includes an organic material, the organic light-emitting device OLED may be easily damaged by external moisture or oxygen. In order to protect the display unit 110, the encapsulant 200 may include one or more stacked insulating layers, and the insulating layers may include organic materials or inorganic materials.

As an example embodiment, the encapsulant 200 may include one or more organic layers or one or more inorganic layers. As an example, the encapsulant 200 may have a structure in which one or more organic layers and one or more inorganic layers are stacked alternately at least one time. In this manner, since the encapsulant 200 protecting the display unit 110 is formed of a plurality of insulating layers, the slimness and flexibility of the display apparatus may be easily implemented.

The planarization layer 300 is formed on the encapsulant 200. The planarization layer 300 includes a flexible transparent organic layer and has a flat top surface. Thus, the reflector 400 may be stably formed on the encapsulant 200 through the planarization layer 300.

The reflector 400 is formed on the planarization layer 300. The reflector 400 may be disposed to overlap at least a region (i.e., non-emission region) around an emission region to reflect light that is incident from the outside. Thus, the reflector 400 may include a metal having a high reflectance.

A plurality of openings 500 are disposed to be adjacent to a plurality of reflectors 400 while corresponding to a plurality of emission regions respectively, and only an emission portion of the organic light-emitting device OLED is exposed through the opening 500. In this manner, since the openings 500 are spaced apart from each other with the opening 500 interposed therebetween, a mirror display, which may function as both an organic light-emitting display apparatus and a mirror, may be implemented.

Hereinafter, the respective components of the organic light-emitting display apparatus 10 according to an embodiment will be described in more detail.

Figure 2:
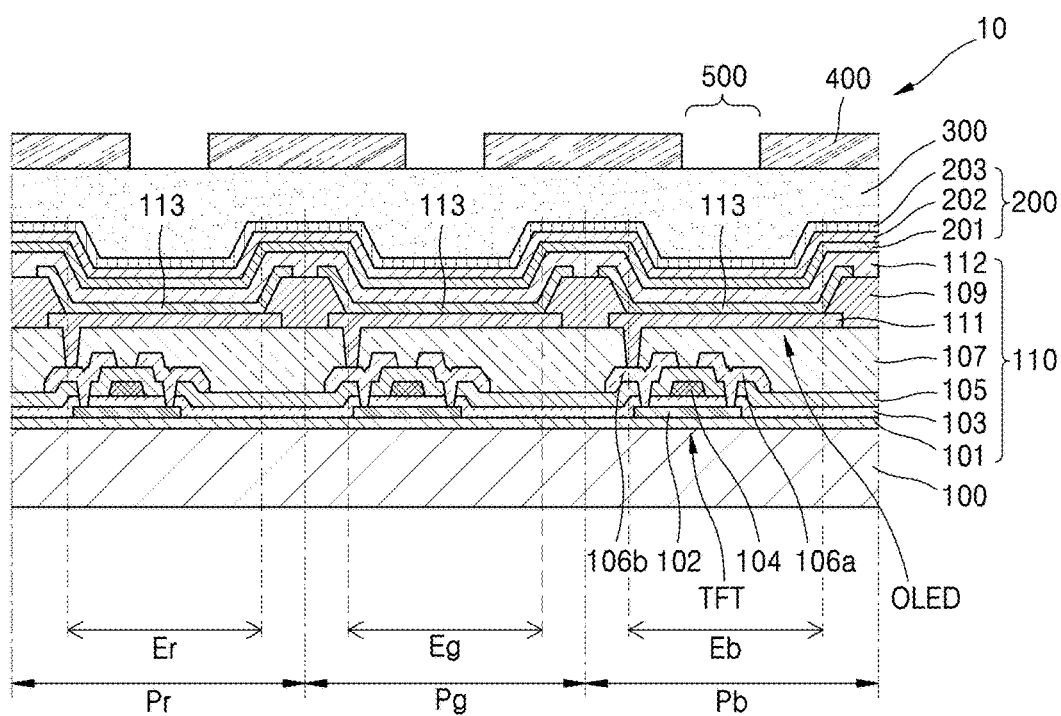
FIG. 2 is an enlarged cross-sectional view of the organic light-emitting display apparatus of FIG. 1.

FIG. 2 is an enlarged cross-sectional view of the organic light-emitting display apparatus 10 of FIG. 1.

FIG. 2 is a detailed cross-sectional view of the respective components included in the display unit 110 of the organic light-emitting display apparatus 10 of FIG. 1. From a plan view, a plurality of pixels are arranged in a matrix fashion in the display unit 110.

The pixels may implement visible rays of various colors.

As an example embodiment, the pixels may include at least a red pixel Pr generating a red visible ray, a green pixel Pg generating a green visible ray, and a blue pixel Pb generating a blue visible ray.

Each pixel includes an organic light-emitting device OLED.

As an example embodiment, each pixel includes electronic devices that are electrically connected to the organic light-emitting device OLED. The electronic devices may include one or more thin film transistors TFT and storage capacitors. The electronic devices may transmit various electrical signals, which are necessary to drive the organic light-emitting device OLED, to the organic light-emitting device OLED.

FIG. 2 illustrates only an organic light-emitting device OLED in each pixel and a driving thin film transistor TFT for driving the organic light-emitting device OLED. However, this is merely for convenience of description, and embodiments are not limited thereto. For example, the organic light-emitting display apparatus 10 may further include a plurality of thin film transistors TFT, storage capacitors, and various interconnection lines.

The thin film transistor TFT illustrated in FIG. 2 is a top gate type and includes an active layer 102, a gate electrode 104, a source electrode 106a, and a drain electrode 106b. A top gate type thin film transistor TFT is used in one embodiment. However, embodiments are not limited thereto, and various types of thin film transistors TFT may also be used. For example, a bottom gate type thin film transistor TFT may also be used.

A buffer layer 101 may be formed on a top surface of the substrate 100 to provide flatness and prevent the infiltration of impure elements. The buffer layer 101 may be deposited of $SiO_2$ and/or $SiN_x$ by various deposition methods, such as plasma-enhanced chemical vapor deposition (PECVD), atmospheric pressure CVD (APCVD), or low pressure CVD (LPCVD), or the like. The buffer layer 101 may not be formed in some embodiments.

The active layer 102 is formed in a region corresponding to each pixel on the buffer layer 101. The active layer 102 may be formed by forming an organic semiconductor or an inorganic semiconductor, such as, for example, silicon or an oxide semiconductor, on a front surface of the substrate 100 on the buffer layer 101 and then patterning the same.

As an example embodiment, when the active layer 102 is formed of silicon, an amorphous silicon layer may be used.

Also, as another example embodiment, the active layer 102 may include a polycrystalline silicon layer formed by crystallizing amorphous silicon.

As an example embodiment, the active layer 102 may include a doped source region and a drain region and may include a channel region between the source region and the drain region.

A gate insulating layer 103 is formed on the active layer 102 to insulate the active layer 102 and the gate electrode 104. The gate insulating layer 103 may include various insulating materials, such as, for example, an oxide or a nitride.

The gate electrode 104 is formed in a predetermined region on the gate insulating layer 103. In one embodiment, the gate electrode 104 is connected to a gate line (not illustrated) that is used to apply an on/off signal to the thin film transistor TFT.

An interlayer insulating layer 105 is formed on the gate electrode 104, and each of the source electrode 106a and the drain electrode 106b contacts one region of the active layer 102 through a contact hole. For example, the source electrode 106a and the drain electrode 106b are formed to contact a source region and a drain region of the active layer 102. The thin film transistor TFT is covered and protected by a passivation layer 107.

The passivation layer 107 may include an inorganic insulating layer and/or an organic insulating layer. The inorganic insulating layer may include, for example, $SiO_2$, $SiN_x$, SiON, $Al_2O_3$, $TiO_2$, $Ta_2O_5$, $HfO_2$, $ZrO_2$, barium strontium titanate (BST), or lead zirconate titanate (PZT). The organic insulating layer may include a general-purpose polymer, such as for example polymethylmethacrylate (PMMA) and polystyrene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. Also, the passivation layer 107 may include a stack of an inorganic insulating layer and an organic insulating layer.

The organic light-emitting device OLED is provided in an emission region on the passivation layer 107.

The organic light-emitting device OLED may include a pixel electrode 111 formed on the passivation layer 107, an opposite electrode 112 opposite to the pixel electrode 111, and an intermediate layer interposed therebetween and including an organic emission layer 113.

Organic light-emitting display apparatuses are classified into a bottom emission type, a top emission type, and a dual emission type according to light-emitting directions. In the bottom emission type, the pixel electrode 111 is provided as a transmission electrode and the opposite electrode 112 is provided as a reflection electrode. In the top emission type, the pixel electrode 111 is provided as a reflection electrode and the opposite electrode 112 is provided as a semi-transmission electrode. In one embodiment, it is assumed that the organic light-emitting display apparatus is the top emission type in which the organic light-emitting device OLED emits light toward the encapsulant 200.

The pixel electrode 111 may include a reflection layer including Ag, Mg, Al, Pt, Pd, Au, Ni, Nd, Ir, Cr, or any combination thereof, and a transmission layer including a material having a high work function, such as, for example, ITO, IZO, ZnO, or $In_2O_3$. The pixel electrode 111 may be patterned and formed in an island shape corresponding to each pixel. Also, the pixel electrode 111 may be connected to an external terminal (not illustrated) to function as an anode electrode.

A pixel definition layer 109 is disposed on the pixel electrode 111 and includes an opening to expose a center of the pixel electrode 111 while covering an edge of the pixel electrode 111. An emission region is defined by forming an organic emission layer 113 in a region defined by the opening. When an emission region defined by an opening is formed in the pixel definition layer 109, a region protruding over the emission region is naturally generated between the emission regions. This region is a non-emission region because an organic emission layer is not formed therein.

The opposite electrode 112 may be provided as a transmission electrode, and may be a thin semi-transmission layer including a metal such as, for example, Li, Ca, LiF/Ca, LiF/Al, Al, Mg, or Ag which have a low work function. By forming a transmission conductive layer of ITO, IZO, ZnO, or $In_2O_3$ on the metal semi-transmission layer, the problem of high resistance caused by the thickness of the thin metal semi-transmission layer may be reduced. The opposite electrode 112 may be formed over the front surface of the substrate 100 in the form of a common electrode. Also, the opposite electrode 112 may be connected to an external terminal (not illustrated) to function as a cathode electrode.

The pixel electrode 111 and the opposite electrode 112 may have opposite polarities to each other.

The intermediate layer may include an organic emission layer 113 that emits light, and the organic emission layer 113 may include a low-molecule organic material or a high-molecule organic material.

In one embodiment, in addition to the organic emission layer 113, the intermediate layer may further include at least one of a hole transport layer (HTL), a hole injection layer (HIL), an electron transport layer (ETL), and an electron injection layer (EIL). In one embodiment, when the organic emission layer 113 includes a high-molecule organic material, only a hole transport layer may be provided between the organic emission layer 113 and the pixel electrode 111. The high-molecule hole transport layer may be formed on the pixel electrode 111 by inkjet printing or spin coating by using poly-(2,4)-ethylene-dihydroxy thiophene (PEDOT) or polyaniline (PANT).

The organic light-emitting device OLED according to an embodiment illustrated in FIG. 2 may emit a white light by electrical driving of the pixel electrode 111 and the opposite electrode 112. In this case, a white light emitted from the organic emission layer 113 may have a high color rendering index (CRI) (>75) and may be close to coordinates (0.33, 0.33), but is not limited thereto.

Examples of a method for implementing a white light in the organic emission layer 113 include a down-conversion wave conversion method and a color mixing method. The down-conversion wave conversion method excites a fluorescent substance by a blue or violet light and mixes various emitted colors to form a wavelength spectrum of a wide range. The color mixing method mixes two basic colors (such as for example blue or orange) or three basic colors (such as for example red, green, and blue) to form a white light. However, embodiments are not limited thereto, and various other materials and methods may also be used to implement a white light.

The organic emission layer 113 is not limited to emitting only a white light, but may also emit one of red, green, and blue lights in each pixel.

The display unit 110 may further include the pixel definition layer 109 that defines a plurality of emission regions. The pixel definition layer 109 is formed such that the pixel definition layer 109 does not cover at least a partial region of the pixel electrode 111. The pixel definition layer 109 may include various insulating materials, such as, for example, an organic material or an inorganic material.

In addition to defining the emission regions, the pixel definition layer 109 may increase the distance between the edge of the pixel electrode 111 and the opposite electrode 112 to prevent the concentration of an electric field on the edge portion of the pixel electrode 111 to prevent a short circuit between the pixel electrode 111 and the opposite electrode 112.

As illustrated in FIG. 2, the encapsulant 200 is formed on the substrate 100 to cover the display unit 110. The encapsulant 200 includes a plurality of stacked insulating layers, and the stacked insulating layers have a structure in which an organic layer 202 and inorganic layers 201 and 203 are alternately stacked.

The inorganic layers 201 and 203 may include a metal oxide, a metal nitride, a metal carbide, or any combination thereof, and may include, for example, an aluminum oxide, a silicon oxide, or a silicon nitride. The inorganic layers 201 and 203 prevent external moisture or oxygen from infiltrating into the organic light-emitting device. The organic layer 202 may include a high-molecule organic compound, and may include any one of epoxy, acrylate, and urethane acrylate. The organic layer 202 may reduce the internal stress of the inorganic layers 201 and 203, reduce the defects of the inorganic layers 201 and 203, and planarize the inorganic layers 201 and 203. Thus, the organic layer 202 may be substituted for the planarization layer 300.

The encapsulant 200 is not limited to the structure illustrated in FIG. 2, but may include at least one sandwich structure in which at least one organic layer is inserted between at least two inorganic layers. As another example, the encapsulant 200 may include at least one sandwich structure in which at least one inorganic layer is inserted between at least two organic layers. As another example, the encapsulant 200 may include a sandwich structure in which at least one organic layer is inserted between at least two inorganic layers and a sandwich structure in which at least one inorganic layer is inserted between at least two organic layers. The top layer of the encapsulant 200, which is exposed to the outside, may be formed of an inorganic layer to prevent the infiltration of moisture.

In this case, the first organic layer may be smaller than the second inorganic layer, and the second organic layer may be smaller than the third inorganic layer. As another example, the first organic layer may be completely covered by the second inorganic layer, and the second organic layer may be completely covered by the third inorganic layer.

As described above, since a plurality of inorganic layers or a thin film encapsulation including an alternate stack of organic layers and inorganic layers is used as the encapsulant, the slimness and/or flexibility of the organic light-emitting display apparatus may be implemented.

FIG. 2 illustrates the cross sections of the planarization layer 300 and the reflector 400 that are sequentially formed on the encapsulant 200. That is, since the reflector 400 is formed on the planarization layer 300, a mirror display may be stably implemented even in a thin film encapsulation structure used in a flexible display apparatus.

For better understanding of this, a comparative example will be described below with reference to FIG. 3.

Figure 3:
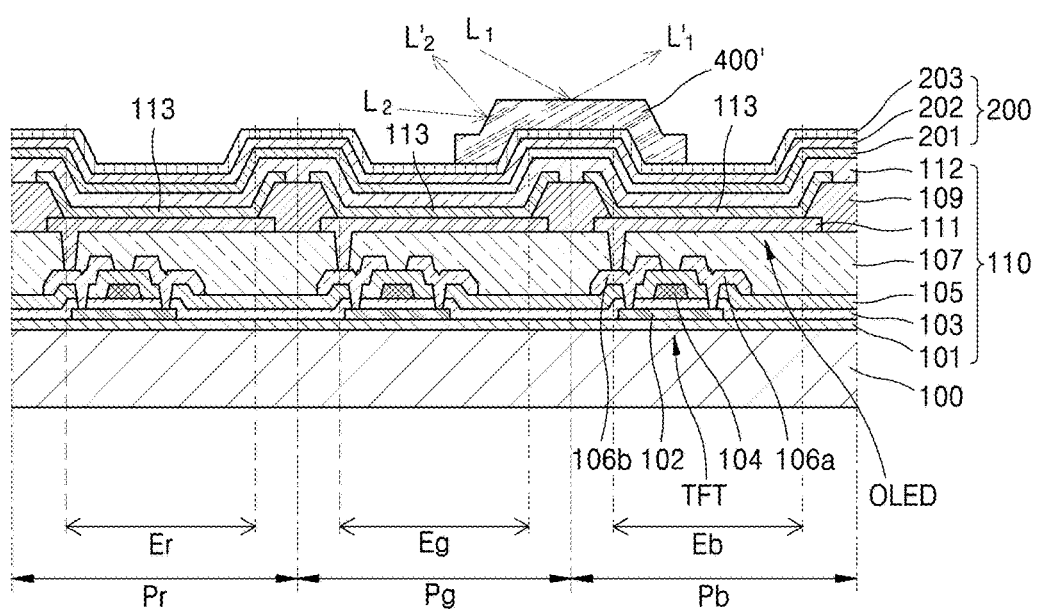
FIG. 3 is a schematic cross-sectional view illustrating the reflection of light in the case of directly patterning a reflector on a thin film encapsulation of an organic light-emitting display apparatus.

FIG. 3 is a schematic cross-sectional view illustrating the reflection of light in the case of directly patterning a reflector on a thin film encapsulation of an organic light-emitting display apparatus.

As illustrated in FIG. 3, when a reflector 400' is directly patterned on a top surface of the encapsulant 200 having a stack of a plurality of thin films, a curvature is also generated in the reflector 400' according to the stack contour of the encapsulant 200 and the display unit 110, and the curvature causes a reflection angle difference between the flat surface and the inclined surface of the reflector 400'. That is, diffused reflection becomes severe due to the difference between an angle between a light $L_1$ incident on a flat surface of the reflector 400' and a light $L_1'$ reflected from the flat surface and an angle between a light $L_2$ incident on an inclined surface of the reflector 400' and a light $L_2'$ reflected from the inclined surface.

Thus, in order to implement a mirror display by the thin-film-encapsulated organic light-emitting display apparatus without the problem of diffused reflection, in an example embodiment, as illustrated in FIG. 2, the planarization layer 300 is formed on the encapsulant 200 and then the reflector 400 is formed on the planarization layer 300.

In this case, the planarization layer 300 has a flat top surface. Thus, since the reflector 400 is formed on the flat top surface of the planarization layer 300, the problem of a reflection angle difference between the positions of the reflector 400 may be solved. As an exemplary embodiment, the planarization layer 300 may be substituted with an organic layer of the encapsulant 200.

The planarization layer 300 may include a flexible transparent organic layer. That is, the planarization layer 300 may include a flexible material to be suitable for a flexible display apparatus without preventing the light emission of the organic light-emitting device OLED disposed under the planarization layer 300.

As an example embodiment, the planarization layer 300 may include any one of polyimide, polyacryl, and polysiloxane.

The reflector 400 corresponds to a mirror plane for implementing a mirror display.

In one embodiment, in the case of the top emission type organic light-emitting display apparatus, the reflector 400 may be disposed to overlap at least a region (such as, for example, non-emission region) around the emission region to reflect the light that is incident on the reflector 400 from the outside. In this manner, since the reflector 400 is disposed on the opposite electrode 112 formed on the pixel definition layer 109 that is not the emission path of the light emitted from the organic light-emitting device OLED, the light extraction rate may be increased.

The reflector 400 may include a metal having a high reflectance and may include any one of aluminum (Al), Al alloy, argentum (Ag), Ag alloy, aurum (Au), and Au alloy.

In one embodiment, the reflector 400 may have a thickness of about 100 nm or more. The reflector 400 may have a visible light reflectance of about 75% to about 90%.

Referring to FIG. 2, the organic light-emitting display apparatus 10 according to an embodiment may further include a plurality of openings 500 that are disposed to be adjacent to a plurality of reflectors 400 while corresponding to a plurality of emission regions respectively. That is, the reflector 400 is disposed in the non-emission region, while the opening 500 is disposed in the emission region.

In this case, as illustrated in FIG. 2, the area of the opening 500 may be smaller than the area of the emission region that is disposed under the opening 500 while corresponding to the opening 500. That is, the area of each of the openings 500, which are formed on the planarization layer 300 while corresponding to the emission regions, may be smaller than the area of each of a red emission region Er, a green emission region Eg, and a blue emission region Eb. Accordingly, a portion of the light incident from the outside is not reflected by the reflector 400 disposed in the non-emission region, passes through the opening 500 disposed in the emission region, and is reflected by the top surface of each of the pixel electrode 111, the pixel definition layer 109, and the opposite electrode 112, thereby preventing the degradation of the reflection quality of the reflector 400 that functions as a mirror.

Also, the area of the opening 500 may be larger than the area of the emission region that is disposed under the opening 500 while corresponding to the opening 500. In this case, since the emission area of the light generated by the organic light-emitting device OLED is increased, the light transmission rate of the organic light-emitting display apparatus 10 may be increased.

In other words, the area of the opening 500 may be different from the area of the emission region corresponding to the opening 500, and due to the variable shape of the opening 500, it is possible to design a display apparatus that harmonizes the reflection quality of a mirror display and the emission efficiency of an organic light-emitting display. Also, in the cross section illustrated in FIG. 2, a width difference "d" between the region of the opening 500 and the emission region corresponding to the opening 500 may be smaller than about 20 μm.

However, in order to satisfy the suitable reflection quality of a mirror plane, the sum of areas of the reflectors 400 may be larger than the sum of areas of the openings 500. Accordingly, as illustrated in the drawings, the area of each of the openings 500, which are formed on the planarization layer 300 while corresponding to the emission regions, may be larger than the area of each of the red emission region Er, the green emission region Eg, and the blue emission region Eb.

Figure 4:
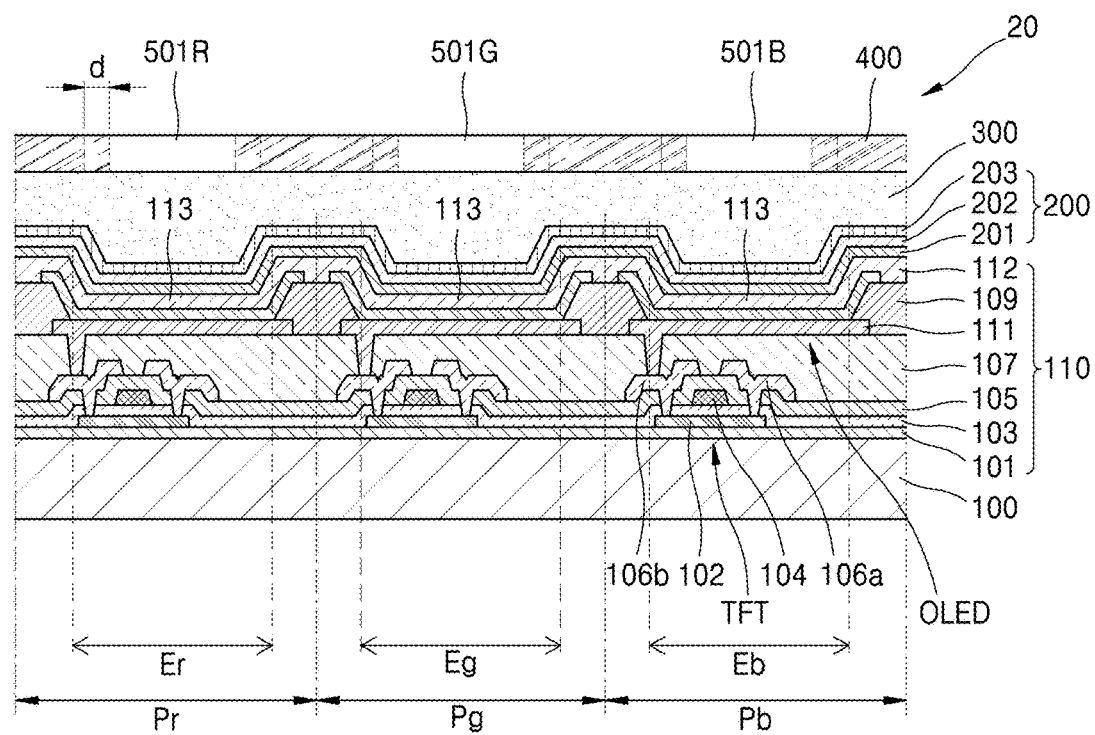
FIG. 4 is a schematic cross-sectional view of an organic light-emitting display apparatus according to another embodiment.

FIG. 4 is an enlarged cross-sectional view of an organic light-emitting display apparatus 20 according to another embodiment.

Referring to FIG. 4, the organic light-emitting display apparatus 20 according to another embodiment may further include a plurality of color filters 501R, 501G, and 501B formed to fill a plurality of openings 500, in comparison with the configuration of the organic light-emitting display apparatus 10 illustrated in FIG. 2.

The color filter may have the same color as emitted from the emission region. That is, the red color filter 501R may have the same color emitted from the red emission region Er corresponding to the red color filter 501R, the green color filter 501G may have the same color emitted from the green emission region Eg corresponding to the green color filter 501G, and the blue color filter 501B may have the same color emitted from the blue emission region Eb corresponding to the blue color filter 501B.

In this manner, since the openings 500 are filled with the color filters 501R, 501G, and 501B, the degradation of the emission efficiency of the organic light-emitting display apparatus 20 may be minimized and the risk of color mixing may be prevented.

Also, in the organic light-emitting display apparatus 20, a pixel definition layer 109 included in a display unit 110 may include a black material or a material having an optical density (OD) of about 1. Accordingly, the reflection from the surface of the pixel definition layer 109 may be reduced.

Hereinafter, a method of manufacturing the organic light-emitting display apparatus 20 will be described in detail.

FIGS. 5 to 11 are sequential cross-sectional views illustrating a method of manufacturing the organic light-emitting display apparatus 20 of FIG. 4.

Since a process of forming a thin film transistor (TFT) array on a substrate 100 has already been described above, redundant descriptions thereof will be omitted for conciseness. Although FIGS. 5 to 11 illustrate a method of manufacturing the organic light-emitting display apparatus 20 of FIG. 4, a method of manufacturing the organic light-emitting display apparatus 10 of FIG. 2 is the same as this except for a color filter forming process of FIG. 11.

Figure 5:
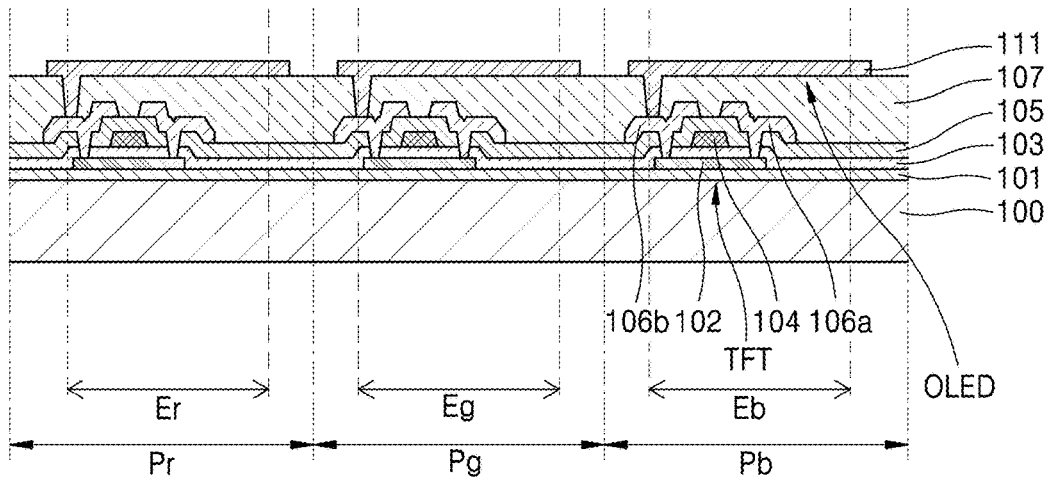
FIGS. 5 to 11 are sequential cross-sectional views illustrating a method of manufacturing the organic light-emitting display apparatus of FIG. 4.

Referring to FIG. 5, a pixel electrode 111 is formed on a TFT array. The pixel electrode 111 may be formed by depositing a metal layer including Ag, Mg, Al, Pt, Pd, Au, Ni, Nd, Ir, Cr, or any combination thereof and a metal oxide layer formed of ITO, IZO, ZnO, or $In_2O_3$ and patterning the same in an island shape in each pixel.

Figure 6:
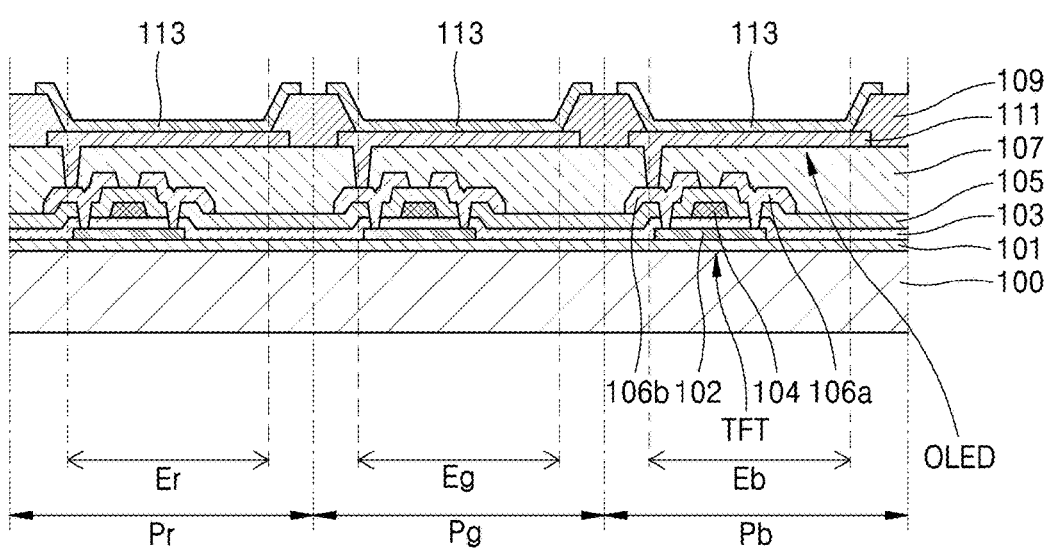

Referring to FIG. 6, a pixel definition layer 109 is formed of an insulating material to a predetermined thickness on the pixel electrode 111 to cover the pixel electrode 111. The pixel definition layer 109 may include at least one organic insulating material selected from polyimide, polyamide, acryl resin, benzocyclobutene, and phenol resin or the like, by a method such as spin coating. An opening is formed in the pixel definition layer 109 to expose a center portion of the pixel electrode 111, and an emission region is defined by depositing an organic emission layer 113 in a region defined by the opening.

Figure 7:
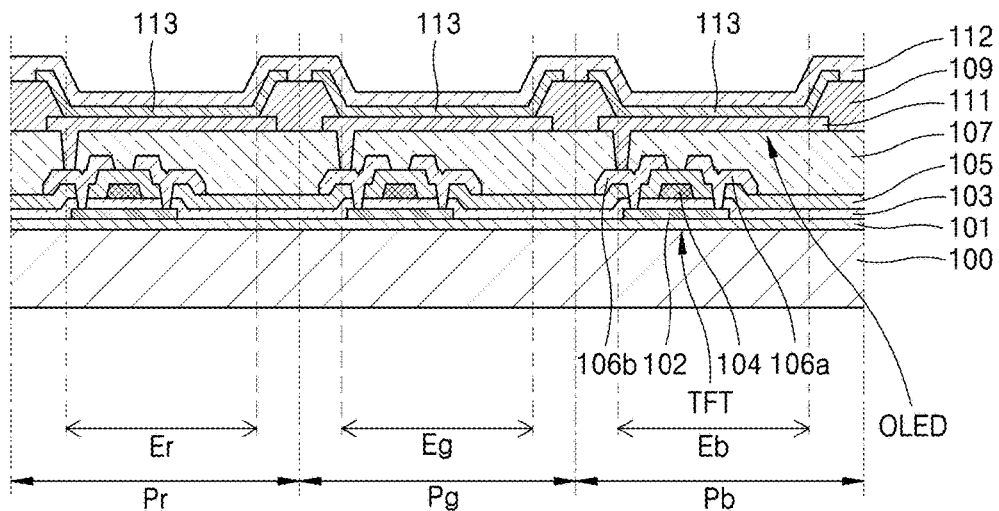

Referring to FIG. 7, an opposite electrode 112 is formed by depositing a semi-transmission layer including a metal such as, for example, Li, Ca, LiF/Ca, LiF/Al, Al, Mg, or Ag to a small thickness over the substrate 100.

Figure 8:
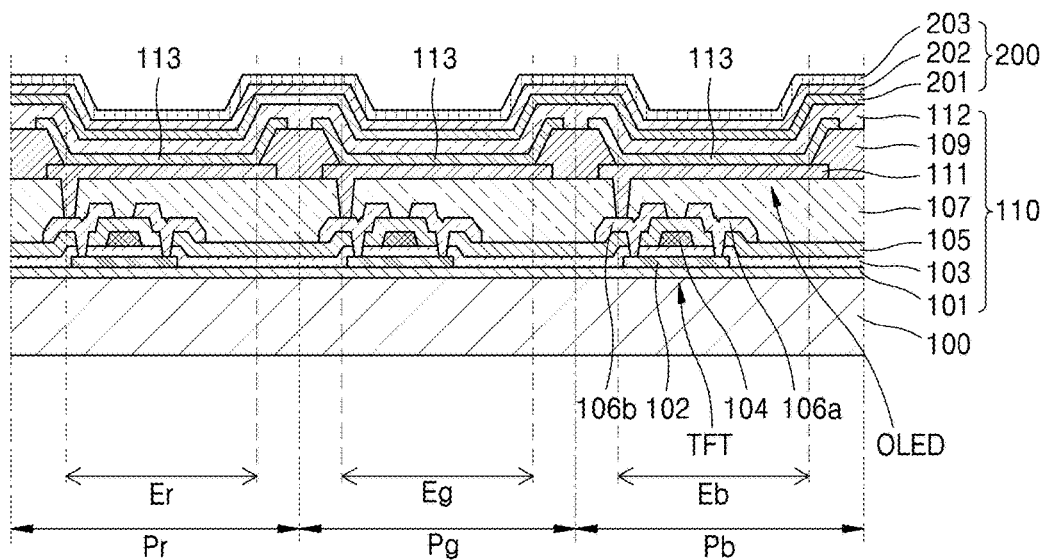

Referring to FIG. 8, an encapsulant 200 is formed on the opposite electrode 112. To this end, an inorganic layer 201 may be formed to a predetermined thickness, an organic layer 202 may be formed on the inorganic layer 201, and an inorganic layer 203 may be formed on the organic layer 202. Of course, the number and configuration of organic layers and inorganic layers and the number of times of alternation thereof are not limited to those illustrated in FIG. 9. The top layer of the encapsulant 200, which is exposed to the outside, may be formed of an inorganic layer to prevent the infiltration of moisture.

Also, a separate layer such as a passivation layer (not illustrated) may be further provided between the encapsulant 200 and the organic light-emitting device OLED, but a filler for a sealing unit according to a sealing substrate is not required.

Referring to FIGS. 9 and 10A to 10F, a planarization layer 300 and a plurality of reflectors 400 are sequentially formed on the encapsulant 200.

Figure 9:
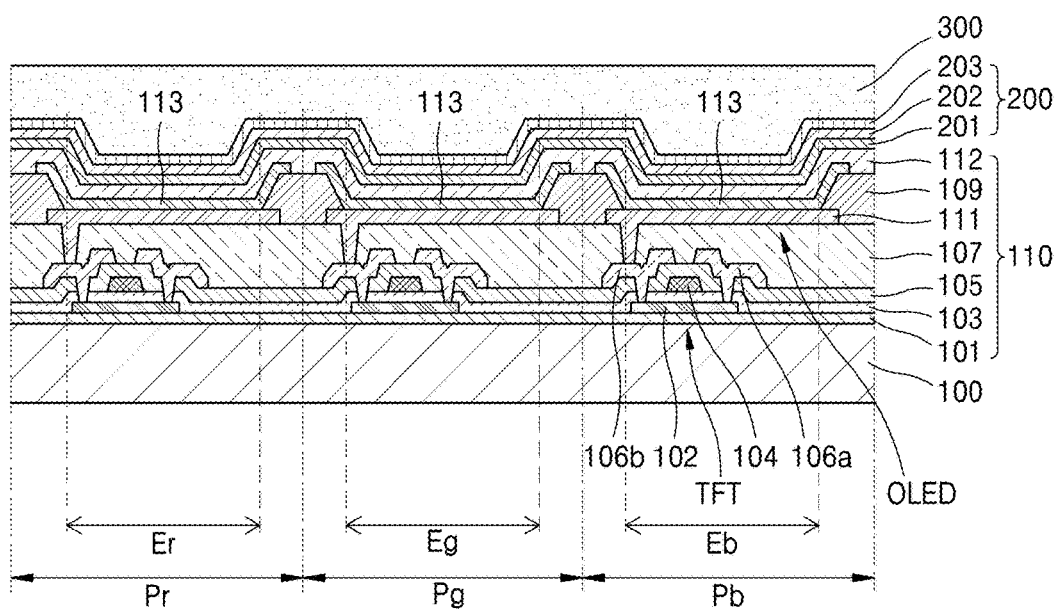

As illustrated in FIG. 9, the planarization layer 300 may have a flat top surface and may include a polyimide monomer, a polyacryl monomer, or a polysiloxane monomer that is formed of a flexible transparent material. The planarization layer 300 may be formed by thermal deposition and may be formed to be thicker than the insulating layer of the encapsulant 200. In one embodiment, the planarization layer 300 may be omitted because the planarization layer 300 may be substituted with an organic layer of the encapsulant 200. An organic layer of the encapsulant 200 may be disposed at the top of the encapsulant 200. The same may be applied to the following embodiments.

The reflector 400 corresponds to a non-emission region on the planarization layer 300, and an opening 500 is formed to be adjacent to the reflector 400 between the plurality of reflectors 400 in an emission region on the planarization layer 300. In some embodiments, the area of the opening 500 may be different from the area of the emission region corresponding to the opening 500, and the sum of areas of the plurality of reflectors 400 may be larger than the sum of areas of the openings 500.

Various methods may be used to form the reflector 400. One embodiment of the method may be used to minimize influence on the planarization layer 300 or organic layers of the encapsulant 200 during forming the reflector 400. Hereinafter, it is described that the planarization layer 300 is disposed below the reflector 400 for convenience of description.

Figure 10A:
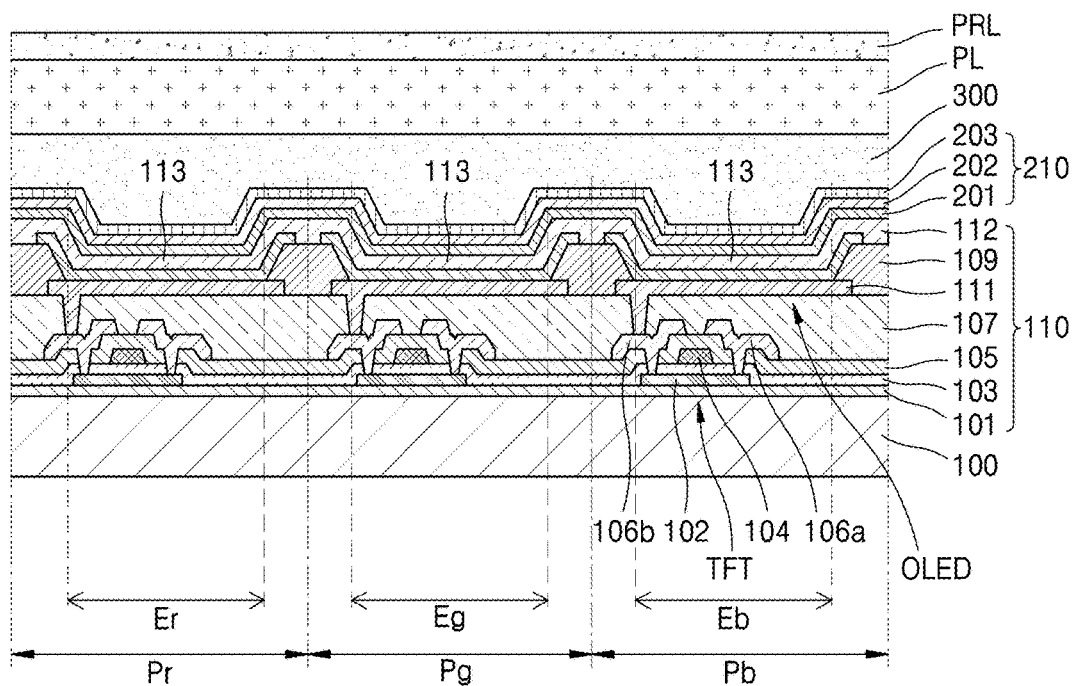

As illustrated in FIG. 10A, a liftoff layer PL containing, for example, fluoropolymer is formed on the planarization layer 300. The fluoropolymer contained in the liftoff layer PL may be a polymer containing from about 20 to about 60 wt % fluorine content. The liftoff layer PL may be formed on the planarization layer 300 by a method such as, for example, a coating method, a printing method, or a deposition method. When the liftoff layer PL is formed by a coating method or a printing method, a patterning process may be performed after performing a curing and polymerization process, as necessary. Next, a photoresist layer PRL is formed on the liftoff layer PL.

Figure 10B:
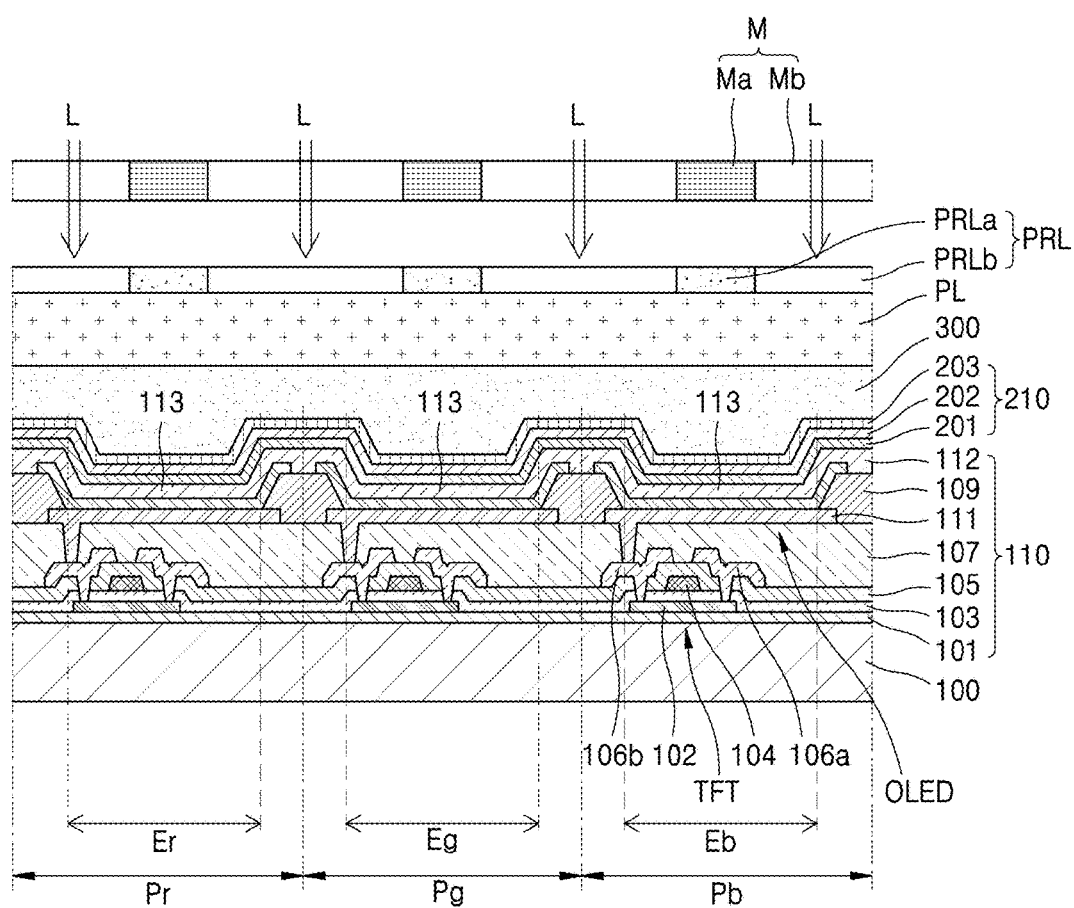

Thereafter, as illustrated in FIG. 10B, the photoresist layer PRL is selectively exposed to light L through a photomask M including a first region Ma through which the light L is not transmitted, and a second region Mb through which the light L is transmitted. A first part PRLa of the photoresist layer PRL at a position corresponding to the first region Ma of the photomask M, is not exposed to light L in emission area Er, Eg, and Eb. A second part PRLb of the photoresist layer PRL at a position corresponding to the second region Mb of the photomask M, is exposed to light L in emission areas Er, Eg, and Eb, and non-emission areas.

Figure 10C:
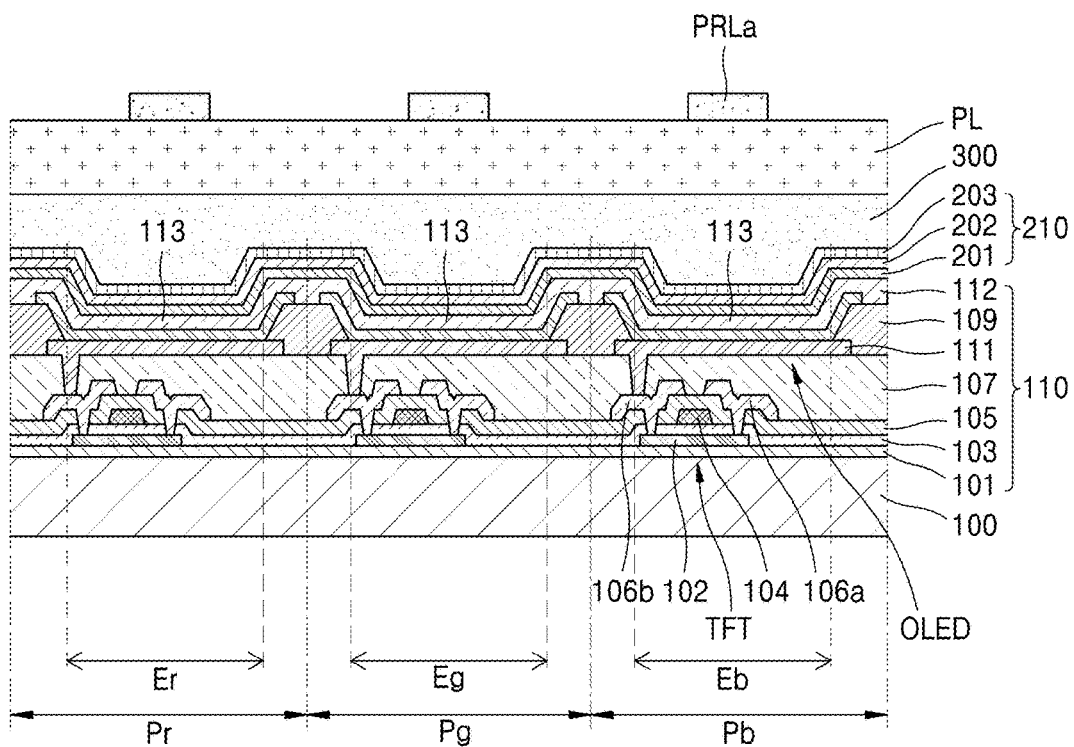

Thereafter, as illustrated in FIG. 10C, in a developing process, the second part PRLb that is exposed to light L is removed from the photoresist layer PRL, and the first part PRLa that is not exposed to light L remains.

Figure 10D:
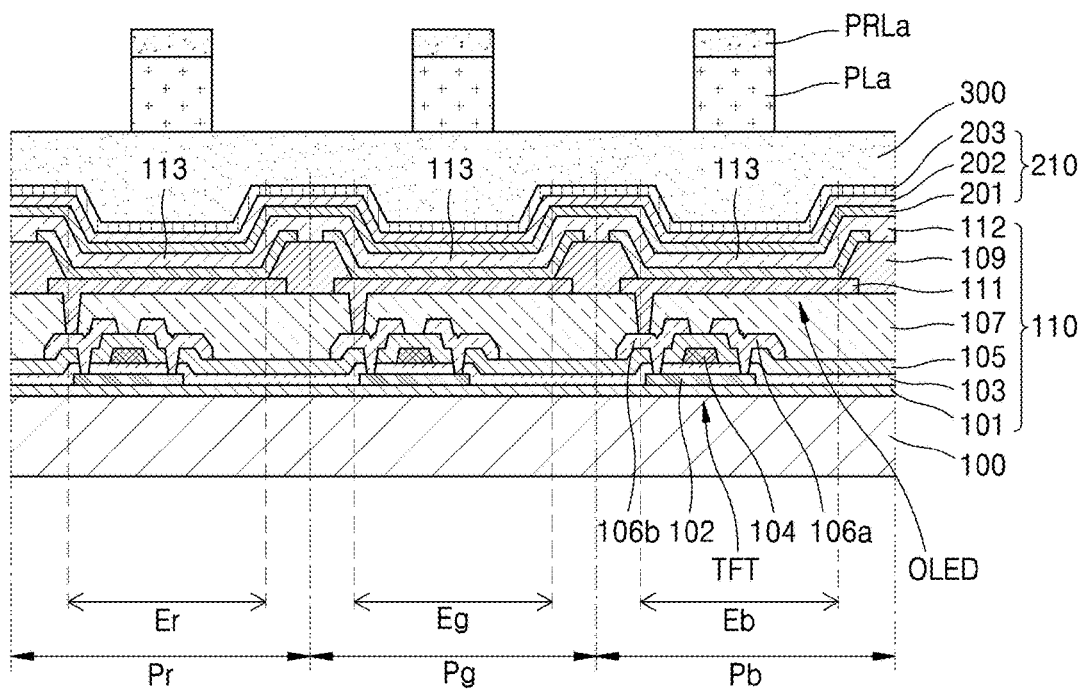

Thereafter, as illustrated in FIG. 10D, the liftoff layer PL is etched using the remaining first part PRLa of the photoresist layer PRL of FIG. 10C.

Since the liftoff layer PL contains fluoropolymer, a solvent capable of etching the fluoropolymer may be used as an etchant.

A first solvent (not shown) containing fluorine may be used as an etchant.

The first solvent may contain, for example, hydrofluoroether. The hydrofluoroether is an electrochemically stable material due to its low interaction with other materials and is an environmentally stable material due to its low global warming potential and toxicity.

In an etching process, a non-etching part PLa of the liftoff layer PRL disposed directly below the first part PRLa of the photoresist layer PRL remains, and the other part of a non-etching part PLa of the liftoff layer PRL is etched.

Accordingly, the region that is not covered by the non-etching part PLa and the first part PRLa is exposed.

Figure 10E:
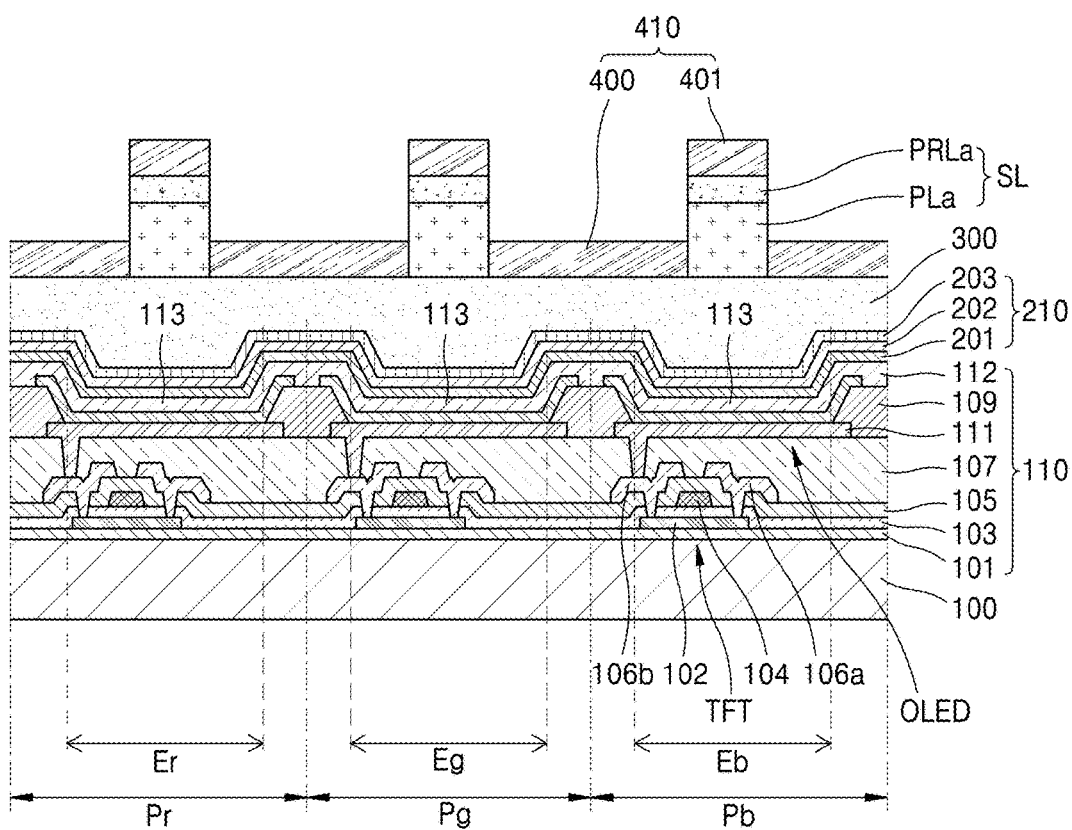

Thereafter, as illustrated in FIG. 10E, a reflector forming layer 410 is formed on the resultant structure of FIG. 10D.

The first part PRLa of the photoresist layer PRL and the non-etching part PLa of the liftoff layer PRL configure a sacrificial layer SL that is thereafter removed in a liftoff process.

The reflector forming layer 410 may be formed by a vacuum deposition method. In a deposition process, the sacrificial layer SL functions as a mask. A part 401 of the reflector forming layer 410, disposed on the first part PRLa of the photoresist layer PRL, is thereafter removed with the sacrificial layer SL. A part of the reflector forming layer 410, disposed on the opening of the sacrificial layer SL, finally becomes the reflector 400.

Figure 10F:
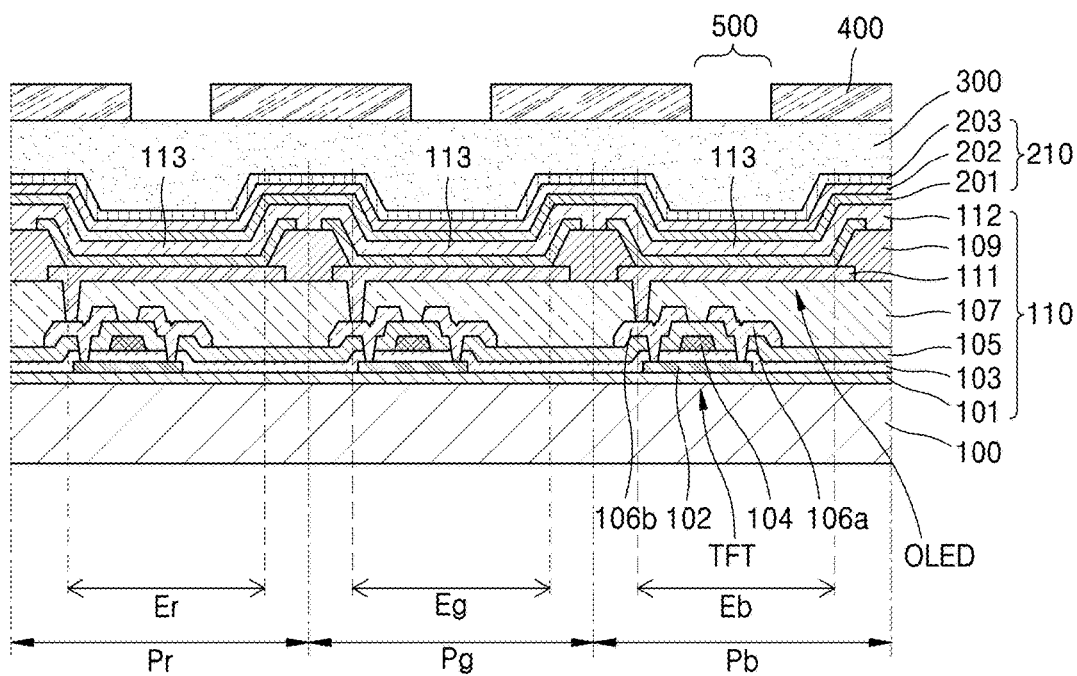

Thereafter, as illustrated in FIG. 10F, a liftoff process is performed on the resultant structure of FIG. 10D.

Since the liftoff layer SL contains fluoropolymer, a second solvent (not illustrated) containing fluorine is used in the liftoff process. Also, since the liftoff process is performed after the reflector forming layer 410 is formed, a material having a low reactivity to the reflector forming layer 410 may be used as the second solvent. The second solvent may contain, for example, hydrofluoroether.

In a liftoff process, a part (401) of the reflector forming layer 410, disposed on the first part PRLa of the photoresist layer PRL, is removed with the sacrificial layer SL. Accordingly, as illustrated in FIG. 10F, the reflector 400 and the openings 500 may be formed on the planarization layer 300. The method of manufacturing the reflector 400 as described hereinabove is one example embodiment.

Figure 11:
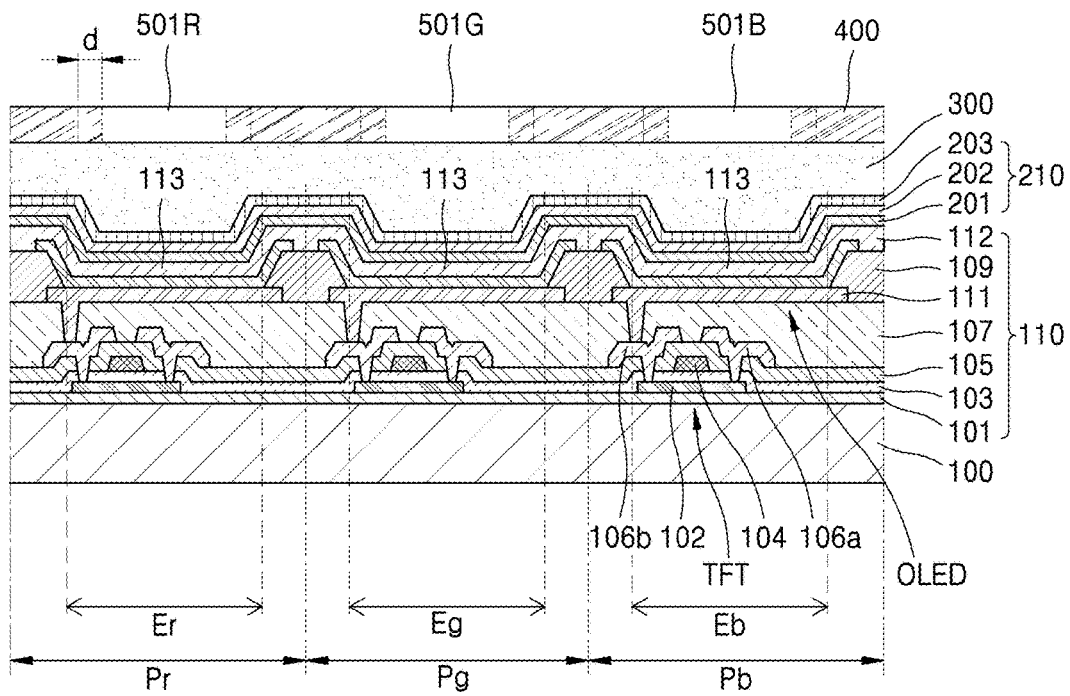

Referring to FIG. 11, a plurality of color filters 501R, 501G, and 501B are formed to fill the openings 500 corresponding to the respective emission regions. The color filters may be formed by spin coating, ink jetting, or flash evaporation.

Although the organic light-emitting device is illustrated as being formed on the passivation layer 107, embodiments are not limited thereto and the organic light-emitting device may also be formed on the gate insulating layer 103 or the interlayer insulating layer 105 by a mask reduction process.

The inventive concept may also be applied to a dual emission type organic light-emitting display apparatus in which the pixel electrode 111 and the opposite electrode 112 are provided as light transmission electrodes.

As described above, according to the one or more embodiments, a flexible mirror display apparatus may be implemented by forming the reflectors 400 on the thin film encapsulant 200

Also, a high reflection quality may be obtained by reducing the diffused reflection in an undesired region.

Also, by using the color filters, the degradation of the light emission efficiency of the organic light-emitting display apparatus may be minimized and the risk of color mixing may be prevented.

It should be understood that the embodiments described herein should be considered in a descriptive sense only and not for purposes of limitation. Descriptions of features or aspects within each embodiment should typically be considered as available for other similar features or aspects in other embodiments.

While certain embodiments have been described with reference to the figures, it will be understood by those of ordinary skill in the art that various changes in form and details may be made therein without departing from the spirit and scope of the inventive concept as defined by the following claims.

What is claimed is:

1. An organic light-emitting display apparatus comprising:
   a substrate;
   a plurality of organic light-emitting devices on the substrate, each of the plurality of organic light-emitting devices comprising a pixel electrode, an organic emission layer, and an opposite electrode;
   a pixel definition layer including a plurality of first openings to expose a center of the pixel electrode and covering an edge of the pixel electrode, the plurality of first openings respectively defining a plurality of emission regions;
   an encapsulant disposed on the plurality of organic light-emitting devices and including an organic layer and at least one inorganic layer, the encapsulant having a top surface;
   a reflector disposed on the top surface of the encapsulant and including a plurality of second openings,
   the plurality of second openings respectively corresponding to the plurality of emission regions,
   wherein at least a width of each of the plurality of second openings is smaller than at least a width of each of the plurality of first openings.

2. The organic light-emitting display apparatus of claim 1, wherein the organic layer has a flat upper surface.

3. The organic light-emitting display apparatus of claim 1, further comprising a plurality of color filters formed to respectively fill the plurality of second openings.

4. The organic light-emitting display apparatus of claim 3, wherein each of the plurality of color filters has a same color as a light emitted from the plurality of emission regions.

5. The organic light-emitting display apparatus of claim 1, wherein a difference between the width of each of the first openings and the width of each of the second openings is about 20 μm or less.

6. The organic light-emitting display apparatus of claim 1, wherein a sum of areas of the reflector is larger than a sum of areas of the plurality of second openings.

7. The organic light-emitting display apparatus of claim 1, wherein the reflector comprises at least one of aluminum (Al), Al alloy, argentum (Ag), Ag alloy, aurum (Au), or Au alloy.

8. The organic light-emitting display apparatus of claim 1, wherein the reflector has a thickness of about 100 nm or more.

9. The organic light-emitting display apparatus of claim 1, wherein the encapsulant comprises at least one of polyimide, polyacryl, or polysiloxane.

10. The organic light-emitting display apparatus of claim 1, wherein the pixel definition layer comprises at least one of a black material or a material having an optical density (OD) of about 1.

11. The organic light-emitting display apparatus of claim 1, the plurality of organic light-emitting devices emit light at least toward the encapsulant.

12. The organic light emitting display apparatus of claim 1, wherein the top surface is a flat top surface.

13. An organic light-emitting display apparatus comprising:
   a substrate;
   a plurality of organic light-emitting devices on the substrate, each of the plurality of organic light-emitting devices comprising a pixel electrode, an organic emission layer, and an opposite electrode;

a pixel definition layer including a plurality of first openings to expose a center of the pixel electrode and covering an edge of the pixel electrode, the plurality of first openings respectively defining a plurality of emission regions;

an encapsulant disposed on the plurality of organic light-emitting device and including at least one organic layer and at least one inorganic layer, the encapsulant having a top surface;

a reflector disposed on the top surface of the encapsulant and including a plurality of second openings, the plurality of second openings respectively corresponding to the plurality of emission regions respectively, wherein at least a width of each of the plurality of second openings is smaller than at least a width of each of the plurality of first openings.

14. The organic light-emitting display apparatus of claim 13, wherein the at least one organic layer comprises an organic layer disposed as a top layer of the encapsulant.

15. The organic light-emitting display apparatus of claim 13, further comprising a planarization layer formed between the encapsulant and the reflector.

16. The organic light-emitting display apparatus of claim 13, further comprising a plurality of color filters formed to respectively fill the plurality of second openings.

17. The organic light-emitting display apparatus of claim 16, wherein each of the plurality of color filters has a same color as a light emitted from the plurality of emission regions.

18. The organic light emitting display apparatus of claim 13, wherein the top surface is a flat top surface.

* * * * *